United States Patent
Rajagiri et al.

(10) Patent No.: US 11,935,604 B2
(45) Date of Patent: *Mar. 19, 2024

(54) STABILIZATION OF SELECTOR DEVICES IN A MEMORY ARRAY

(71) Applicant: Micron Technology, Inc., Boise, ID (US)

(72) Inventors: Avinash Rajagiri, Boise, ID (US); Shinji Sato, Kanagawa (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/971,340

(22) Filed: Oct. 21, 2022

(65) Prior Publication Data
US 2023/0040099 A1 Feb. 9, 2023

Related U.S. Application Data

(63) Continuation of application No. 16/991,535, filed on Aug. 12, 2020, now Pat. No. 11,501,842.

(51) Int. Cl.
*G11C 16/14* (2006.01)
*G11C 16/04* (2006.01)
(Continued)

(52) U.S. Cl.
CPC ........ *G11C 16/349* (2013.01); *G11C 16/0433* (2013.01); *G11C 16/0483* (2013.01);
(Continued)

(58) Field of Classification Search
CPC .............. G11C 16/349; G11C 16/3431; G11C 16/3445; G11C 16/0483; G11C 16/28; G11C 16/14; G11C 16/3404
See application file for complete search history.

(56) References Cited

U.S. PATENT DOCUMENTS 9,123,425 B2 * 9/2015 Dong ..................... H10B 43/35
9,922,705 B1 3/2018 Diep et al.
(Continued)

FOREIGN PATENT DOCUMENTS

WO WO-2022035986 A1 2/2022

OTHER PUBLICATIONS

U.S. Appl. No. 16/991,535 U.S. Pat. No. 11,501,842, filed Aug. 12, 2020, Memory Device and Method With Stabilization of Selector Devices in Strings in a Memory Array of the Memory Device.
(Continued)

*Primary Examiner* — Mushfique Siddique
(74) *Attorney, Agent, or Firm* — Schwegman Lundberg & Woessner, P.A.

(57) ABSTRACT

A variety of applications can include memory devices designed to provide stabilization of selector devices in a memory array of the memory device. A selector stabilizer pulse can be applied to a selector device of a string of the memory array and to a memory cell of multiple memory cells of the string with the memory cell being adjacent to the selector device in the string. The selector stabilizer pulse can be applied directly following an erase operation to the string to stabilize the threshold voltage of the selector device. The selector stabilizer pulse can be applied as part of the erase algorithm of the memory device. Additional devices, systems, and methods are discussed.

22 Claims, 8 Drawing Sheets

(51) Int. Cl.
  *G11C 16/28* (2006.01)
  *G11C 16/34* (2006.01)
(52) U.S. Cl.
  CPC .............. *G11C 16/14* (2013.01); *G11C 16/28* (2013.01); *G11C 16/3404* (2013.01); *G11C 16/3431* (2013.01); *G11C 16/3445* (2013.01)

(56) References Cited

U.S. PATENT DOCUMENTS

| | | |
|---|---|---|
| 10,115,464 B1 | 10/2018 | Lu et al. |
| 10,153,051 B1 | 12/2018 | Chen et al. |
| 10,629,272 B1 | 4/2020 | Lu et al. |
| 10,665,306 B1 | 5/2020 | Chen et al. |
| 10,790,003 B1 | 9/2020 | Chen et al. |
| 11,501,842 B2 | 11/2022 | Rajagiri et al. |
| 2007/0253253 A1 | 11/2007 | Aritome |
| 2014/0160848 A1* | 6/2014 | Dutta ..................... G11C 16/10 365/185.17 |
| 2014/0198575 A1* | 7/2014 | Dutta .................. G11C 16/3418 365/185.17 |
| 2016/0055915 A1 | 2/2016 | Dong et al. |
| 2017/0084345 A1 | 3/2017 | Yang et al. |
| 2019/0214067 A1 | 7/2019 | Nam et al. |
| 2019/0244673 A1* | 8/2019 | Yang ....................... G11C 16/14 |
| 2019/0385680 A1* | 12/2019 | Dunga ............... G11C 16/0466 |
| 2020/0013467 A1 | 1/2020 | Yamada |
| 2022/0051735 A1 | 2/2022 | Rajagiri et al. |

OTHER PUBLICATIONS

"International Application Serial No. PCT/US2021/045588, International Search Report dated Dec. 1, 2021", 4 pgs.
"International Application Serial No. PCT/US2021/045588, Written Opinion dated Dec. 1, 2021", 7 pgs.
"International Application Serial No. PCT US2021 045588, International Preliminary Report on Patentability dated Feb. 23, 2023", 9 pages.

* cited by examiner

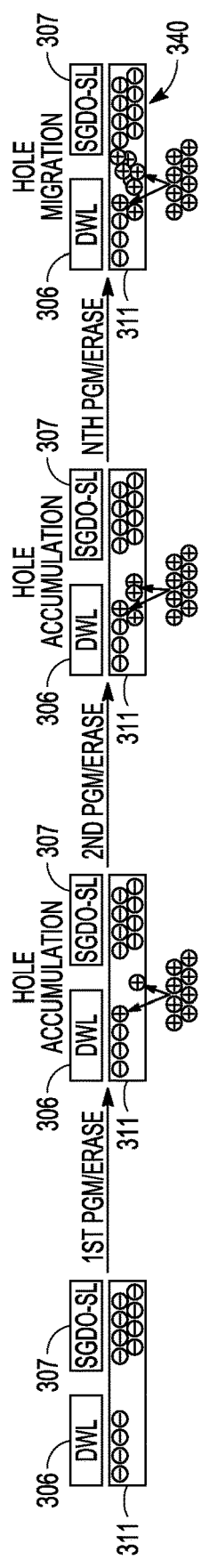
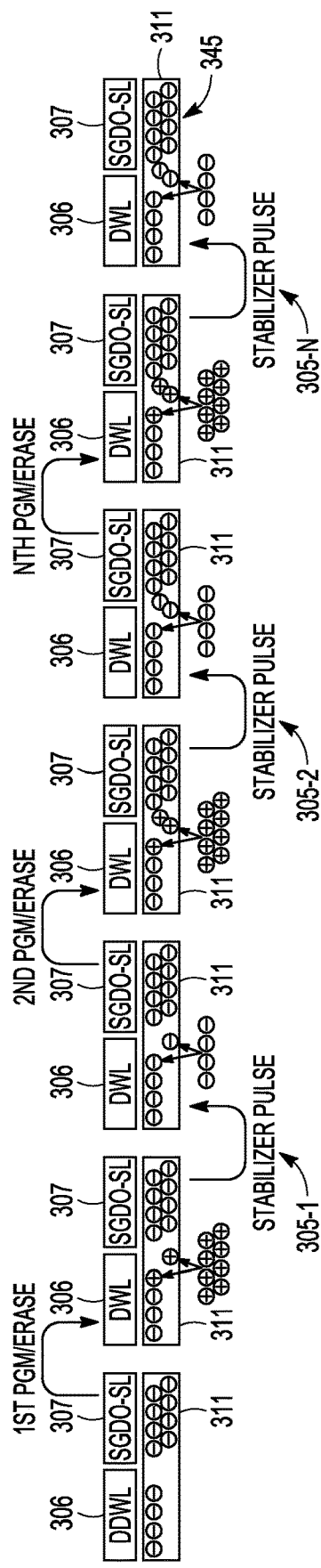
FIG. 3A
FIG. 3B

STABILIZATION OF SELECTOR DEVICES IN A MEMORY ARRAY

PRIORITY APPLICATION

This application is a continuation application of U.S. application Ser. No. 16/991,535, filed 12 Aug. 2020, which application is incorporated herein by reference in its entirety.

FIELD OF THE DISCLOSURE

Embodiments of the disclosure relate generally to memory devices and operation of memory devices, and more specifically, to erase operations of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

Using 3D architectures for memory devices, such as NAND memory devices, can provide increased capacity over planar structures. The memory arrays for 3D structures can include memory cells stacked vertically as strings of memory cells. In selecting one or more strings for access to given memory cells, gating structures can be located at the top and bottom of these strings with memory cells storing data therebetween. The gating structures can include a select gate transistor with its drain coupled to a data line, such as a bitline, at one end of a string and a select gate transistor with its source coupled to a source line at the other end of the string. In efforts to streamline processing, the gating structures can be fabricated similar to the structures of the memory cells. These can lead to reliability issues related to the memory cell structure. Providing techniques to address reliability issues of the gating structures with limited management can reduce complexity of operating the memory device.

BRIEF DESCRIPTION OF THE DRAWINGS

The drawings, which are not necessarily drawn to scale, illustrate generally, by way of example, but not by way of limitation, various embodiments discussed in the present document.

FIG. 3A illustrates program and erase cycling without application of a selector stability pulse, according to various embodiments.

FIG. 3B illustrates program and erase cycling with application of stabilizer pulses to an access line and a select line to a select gate device of FIG. 3A, according to various embodiments.

DETAILED DESCRIPTION

Figure 1:
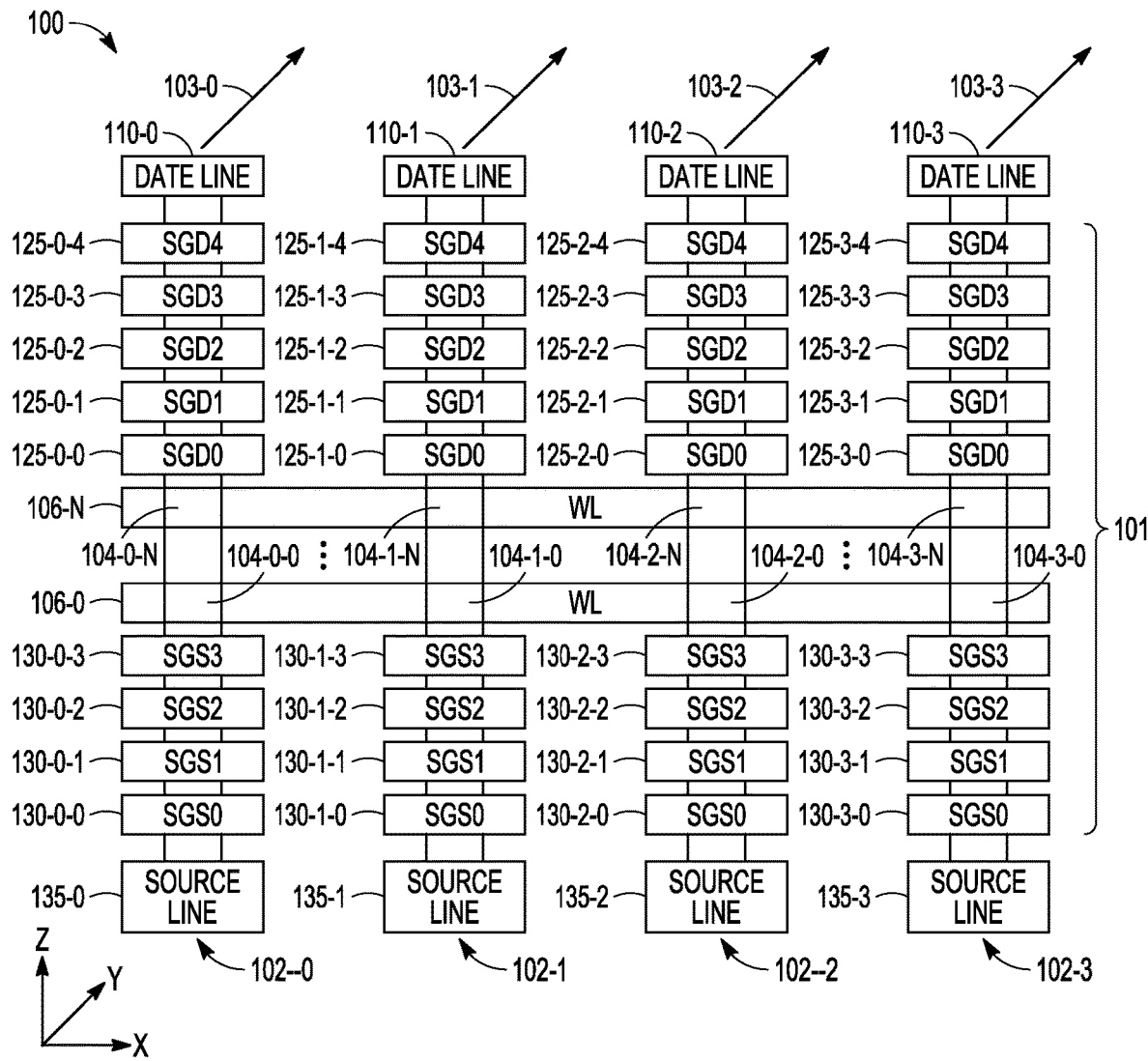
FIG. 1 is a representation of a three-dimensional memory array of a memory die, where the three-dimensional memory array has a memory block that includes multiple sub-blocks, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current-encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) is referred to as a dual-level cell (DLC). A triple-level cell (TLC) refers to a memory cell that can store three bits of data per cell (e.g., one of eight programmed states). A quad-level cell (QLC) can store four bits of data per cell, and a penta-level cell (PLC) can store 5 bits of data per cell.

In a string of memory cells in a 3D memory device such as a 3D NAND memory, access to the string to operate on a memory cell in the string cell can be controlled by a selector device, such as a select gate, which in the string is in series with the memory cells of the string. In a 3D NAND memory die, a select gate can be structured similar to memory cells and is susceptible to charge loss through bake and through lateral migration due to accumulated holes from an adjacent memory cell to the select gate. With the select gate of the NAND memory being a data line-side selector device and the adjacent memory cell being one of a number of dummy memory cells, lateral migration is due to holes migrating within a charge storage node, which is common across a whole memory pillar. The holes, which are near and under a top word line to the top dummy memory cell adjacent a lowest data line-side selector device, migrate within the charge storage node to the region of the data line-side selector device and combine with the electrons under the lowest data line-side selector device in the charge storage node of the the lowest data line-side selector device. A dummy memory cell is a memory cell that is not configured to store information. An access line to a dummy memory cell is referred to as a dummy access line. As the hole concentration increases, eventually, due to Poole-Frenkel effect, the holes start to migrate towards the selector device, which results in lowered threshold voltage, Vt, of the selector device through program and erase cycles. This effect is worse at high temperatures where migration is highest. This accumulation of holes causes the Vt of the selector device to be unstable with respect to consistent operation.

One approach to address this possible instability in a NAND memory die is to expand the on/off margin of a selector device, such as a SGD. From a processing perspective, expanding the on/off margin can be very challenging. Another approach is to perform system level maintenance of the selector device, which has firmware complexities that may result in performance issues. With the selector device being the SGD adjacent the memory cells of a string, system level maintenance of the SGD can involve performing touchup on the SGD every X number of program and erase cycles. This touchup procedure would also include scan of the SGD Vt and record keeping at the system level on a block-level basis. Performing such maintenance of a SGD does not provide an efficient solution for a component-based NAND memory die.

In various embodiments, reliability in a 3D memory device, such as a 3D NAND memory die, can be attained by stabilization of the Vt of a selector device in each string of the memory array of the 3D NAND. In this approach, after one or more erase operations, a selector stability pulse is generated to neutralize the holes near the selector device region adjacent the series of memory cells in strings of the memory cell, which results in stable Vts of the selector devices of the strings through program and erase cycles. The selector stability pulse can be generated after each erase operation. This provides a zero maintenance solution from the view point of after-xmanufacture operation of the memory die, as trims for the memory die can be created in optimization procedures for selector device stability.

Figure 7:
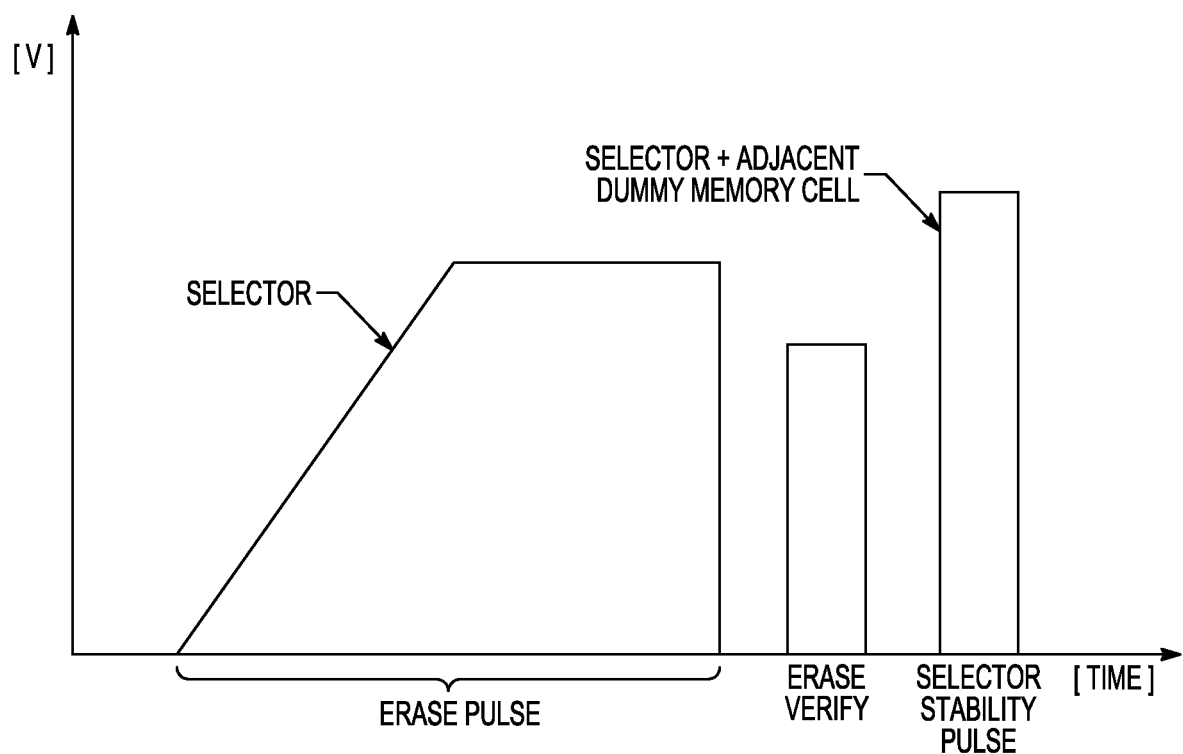
FIG. 7 illustrates timing of end of an erase operation and an application of a selector pulse associated with FIG. 3B, according to various embodiments.
Figure 8:
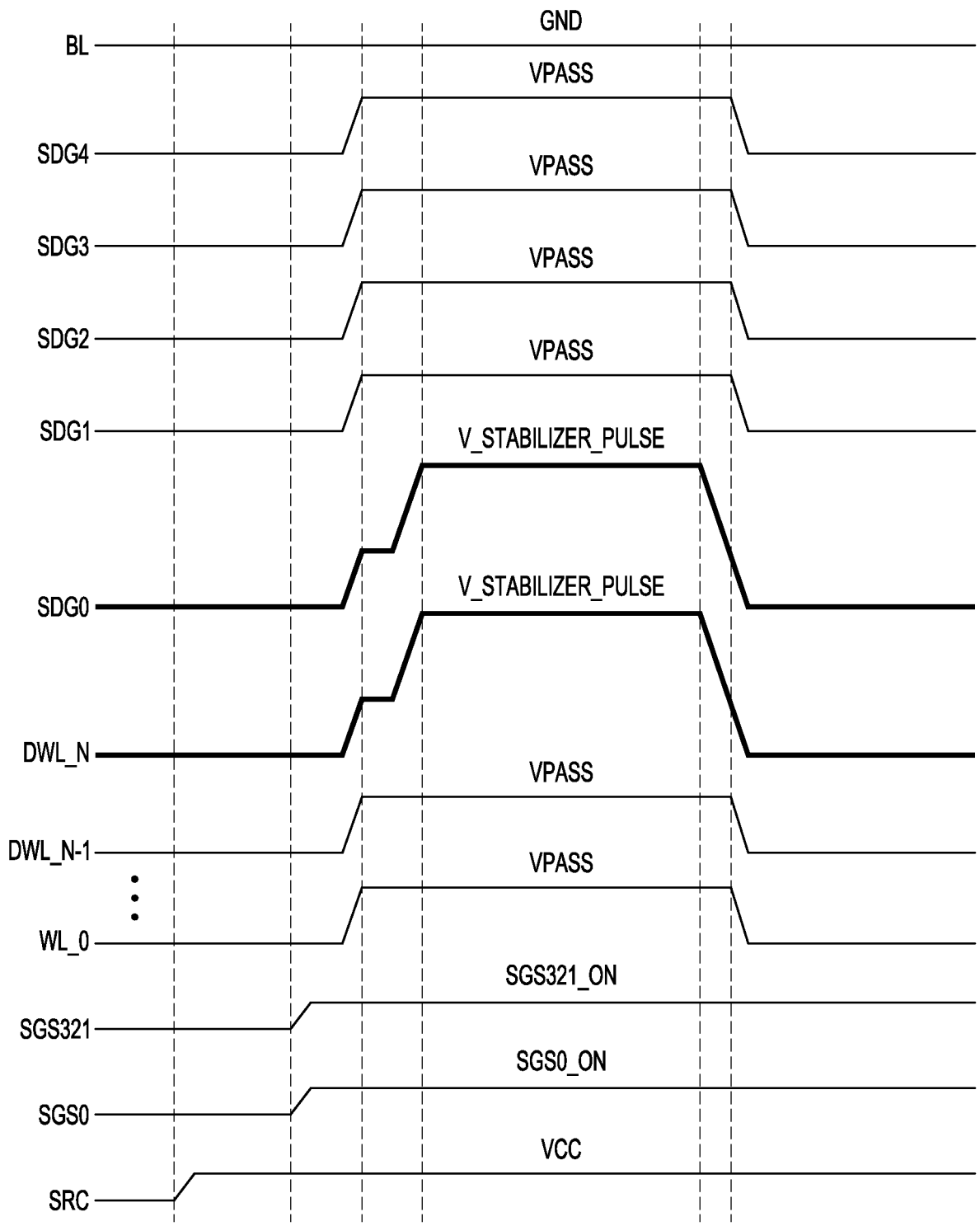
FIG. 8 illustrates timing of an application of a selector pulse associated with FIG. 2 and FIG. 3B, according to various embodiments.

The selector stability pulse procedure can be implemented for a memory device having a memory array including strings of cells, where each string includes a selector device and multiple memory cells, with the selector device coupled to a select line and each of the multiple memory cells coupled to a respective access line. A memory controller, including processing circuitry including one or more processors, can be configured to perform operations to perform the selector stability pulse procedure. The operations can include applying a program pulse, as a selector stabilizer pulse, to the select line coupled to the selector device of a string of the memory array and to the access line coupled to a memory cell of the multiple memory cells of the string with the memory cell being adjacent to the selector device in the string, for example as shown in FIG. 8. The program pulse is applied directly following an erase operation to the string. The erase operation can include a verify procedure, for example as shown in FIG. 7.

FIG. 1 is a representation of a 3D memory array 100 of a memory die, where the 3D memory array 100 has a memory block 101 that includes sub-blocks 102-0, 102-1, 102-2, and 102-3. Though one memory block of memory cells is shown, a memory die can include more than one block of memory cells. Though four sub-blocks are shown in the block 101 of memory cells, a block of memory cells can include more or less than four sub-blocks. Sub-block 102-0 includes a string having selector devices 125-0-0 . . . 125-0-4 arranged vertically in a series with a top-most selector device 125-0-4 coupled at one end of the series, to couple the string to a data line 110-0. Selector device 125-0-0 of the sub-block 102-0 is coupled to a top-most memory cell 104-0-N of a set of memory cells 104-0-0 . . . 104-0-N that are arranged vertically in the string of sub-block 102-0. The memory cells 104-0-0 . . . 104-0-N are coupled to access lines 106-0 . . . 106-N, respectively. The bottom-most memory cell 104-0-0 of the set of memory cells of the string is coupled to a top-most selector device 130-0-3 of selector devices 130-0-0 . . . 130-0-3 arranged vertically in a series with bottom-most selector device 130-0-0 coupled to a source line 135-0 for sub-block 102-0. The selector devices 125-0-0 . . . 125-0-4 can be select gates SGDs fabricated as transistors with the structure of the memory cells 104-0-0 . . . 104-0-N and be referred to as SGD0, SGD1, SGD2, SGD3, and SGD4 of sub-block 102-0. The selector devices 130-0-0 . . . 130-0-3 can be source-side select gates, SGSs, fabricated as transistors with the structure of the memory cells 104-0-0 . . . 104-0-N and be referred to as SGS0, SGS1, SGS2, and SGS3 of sub-block 102-0. The string of sub-block 102-0 can be repeated along direction 103-0 in the y-direction, with select lines to the selector devices 125-0-0 . . . 125-0-4 and to the selector devices 130-0-0 . . . 130-0-3 effectively along the direction 103-0.

Sub-block 102-1 includes a string having selector devices 125-1-0 . . . 125-1-4 arranged vertically in a series with a top-most selector device 125-1-4 coupled at one end of the series, to couple the string to a data line 110-1. Selector device 125-1-0 of the sub-block 102-1 is coupled to a top-most memory cell 104-1-N of a set of memory cells 104-1-0 . . . 104-1-N that are arranged vertically in the string of sub-block 102-1. The memory cells 104-1-0 . . . 104-1-N are coupled to access lines 106-0 . . . 106-N, respectively. The bottom-most memory cell 104-1-0 of the set of memory cells of the string is coupled to a top-most selector device 130-1-3 of selector devices 130-1-0 . . . 130-1-3 arranged vertically in a series with bottom-most selector device 130-1-0 coupled to a source line 135-1 for sub-block 102-1. The selector devices 125-1-0 . . . 125-1-4 can be select gates SGDs fabricated as transistors with the structure of the memory cells 104-1-0 . . . 104-1-N and be referred to as SGD0, SGD1, SGD2, SGD3, and SGD4 of sub-block 102-1. The selector devices 130-1-0 . . . 130-1-3 can be select gates SGSs fabricated as transistors with the structure of the memory cells 104-1-0 . . . 104-1-N and be referred to as SGS0, SGS1, SGS2, and SGS3 of sub-block 102-1. The string of sub-block 102-1 can be repeated along direction 103-1 in the y-direction, with select lines to the selector devices 125-1-0 . . . 125-1-4 and to the selector devices 130-1-0 . . . 130-1-3 effectively along the direction 103-1.

Sub-block 102-2 includes a string having selector devices 125-2-0 . . . 125-2-4 arranged vertically in a series with a top-most selector device 125-2-4 coupled at one end of the series, to couple the string to a data line 110-2. Selector device 125-2-0 of the sub-block 102-2 is coupled to a top-most memory cell 104-2-N of a set of memory cells 104-2-0 . . . 104-2-N that are arranged vertically in the string of sub-block 102-2. The memory cells 104-2-0 . . . 104-2-N are coupled to access lines 106-0 . . . 106-N, respectively. The bottom-most memory cell 104-2-0 of the set of memory cells of the string is coupled to a top-most selector device 130-2-3 of selector devices 130-2-0 . . . 130-2-3 arranged vertically in a series with bottom-most selector device 130-2-0 coupled to a source line 135-2 for sub-block 102-2. The selector devices 125-2-0 . . . 125-2-4 can be select gates SGDs fabricated as transistors with the structure of the memory cells 104-2-0 . . . 104-2-N and be referred to as SGD0, SGD1, SGD2, SGD3, and SGD4 of sub-block 102-2. The selector devices 130-2-0 . . . 130-2-3 can be select gates SGSs fabricated as transistors with the structure of the memory cells 104-2-0 . . . 104-2-N and be referred to as SGS0, SGS1, SGS2, and SGS3 of sub-block 102-2. The string of sub-block 102-2 can be repeated along direction 103-2 in the y-direction, with select lines to the selector devices 125-2-0 . . . 125-2-4 and to the selector devices 130-2-0 . . . 130-2-3 effectively along the direction 103-2.

Sub-block 102-3 includes a string having selector devices 125-3-0 . . . 125-3-4 arranged vertically in a series with a top-most selector device 125-3-4 coupled at one end of the series, to couple the string to a data line 110-3. Selector device 125-3-0 of the sub-block 102-3 is coupled to a top-most memory cell 104-3-N of a set of memory cells 104-3-0 . . . 104-3-N that are arranged vertically in the string of sub-block 102-3. The memory cells 104-3-0 . . . 104-3-N are coupled to access lines 106-0 . . . 106-N, respectively. The bottom-most memory cell 104-3-0 of the set of memory cells of the string is coupled to a top-most selector device 130-3-3 of selector devices 130-3-0 . . . 130-3-3 arranged vertically in a series with bottom-most selector device 130-3-0 coupled to a source line 135-3 for sub-block 102-3. The selector devices 125-3-0 . . . 125-3-4 can be select gates SGDs fabricated as transistors with the structure of the memory cells 104-3-0 . . . 104-3-N and be referred to as SGD0, SGD1, SGD2, SGD3, and SGD4 of sub-block 102-3. The selector devices 130-3-0 . . . 130-3-3 can be select gates SGSs fabricated as transistors with the structure of the memory cells 104-3-0 . . . 104-3-N and be referred to as SGS0, SGS1, SGS2, and SGS3 of sub-block 102-2. The string of sub-block 102-3 can be repeated along direction 103-3 in the y-direction, with select lines to the selector devices 125-3-0 . . . 125-3-4 and to the selector devices 130-3-0 . . . 130-3-3 effectively along the direction 103-3.

The memory array 100 can be implemented in a replacement gate (RG) NAND memory die. The term RG refers to a process of fabricating the NAND memory die, which process can also be referred to as a "gate-last" processing technique. In the RG processing technique, sacrificial regions are deposited to be later removed in the processing of the memory die followed by forming material for transistor gates of the memory cells in a string.

In a non-limiting example, each of the four sub-blocks 102-0, 102-1, 102-2, and 102-3 of the memory block 101 can be structured for 16 KB in which 16K*8 data lines are implemented. Each of the four sub-blocks 102-0, 102-1, 102-2, and 102-3 can have 16K*8 strings along directions 103-0, 103-1, 103-2, and 103-3, respectively, with each string formed in a semiconductor pillar along its respective direction. Each string can have a number of horizontal levels, referred to as tiers, for example, the strings of the memory array 100 can have 128 tiers. On a tier (horizontal level), a string can have a memory cell, a SGD, or a SGS. SGDs and SGSs are not shared across sub-blocks 102-0, 102-1, 102-2, and 102-3 for reading from or writing to memory cells. In some instances, SGD0, SGD1, SGD2, SGD3, and SGD4 of each string can be arranged with a number of the upper-most SGDs, for example SGD3 and SGD4, arranged as switches to operate as gate-induced drain-leakage (GIDL) generators. The SGS0, SGS1, SGS2, and SGS3 of each string can also be arranged with a number of the lower-most SGSs, for example SGS0, arranged as a switch to operate as a GIDL generator. These GIDL generators can be used to assist during an erase operation to speed up the charging of the body of the memory cell strings in a selected sub-block. With SGD3 and SGD4 arranged with respect to GIDL generators, SGD0, SGD1, and SGD2 in each string can operate as single select gate on the drain side and SGS1, SGS2, and SGS3 in each string can operate as a single select gate on the source side.

The selector devices of the memory array 100 of FIG. 1 can be structured like the memory cells of the memory array 100 such that common processing can be used to reduce fabrication complexity and cost with respect to fabrication using different processes. Since every layer of the memory array is being fabricated in the same manner, the layer fabrication follows the manner in which each access line or memory cell is being fabricated. The structure of the memory cells effectively dictates how a selector device, such as a select gate, is also fabricated. Typically, the design for a memory cell is to make the memory cell as small as possible so that more memory cells can be stacked in a given pillar. Though memory cells are being scaled to thinner and thinner vertical levels, such scaling for the selector device has an issue associated with the selector device's responsibility to select an entire string. This responsibility of the selector device can be more critical than a regular memory cell. The selector device built like a memory cell has a small feature size, which can lead to current leakage. With a small channel feature, the selector device may not have good control for turn off of the string. One option is to create a selector device, such as a select gate, that is much thicker having a relatively long channel. However, in this option, the selector device and the memory cells would not have a common fabrication process and a switch to a process different from forming memory cells would be used in making the selector device. To use a selector device with the memory cell structure, compensation for the small size of the selector device can be provided by having multiple selector devices. These multiple selector devices, for example on the drain side of a string, can operate as a single selector device with only one electrical signal to controlling it; and, in some examples multiple selector devices and one end of the string may be operated as two or more separately operated groups. In such an example, each such selector device can be coupled to an individual respective select line, or each group of selector devices may be coupled to a respective select line. For example, with SGD3 and SGD4 arranged with respect to GIDL generators, SGD0, SGD1, and SGD2 of FIG. 1 can be electrically ganged together and controlled like a single large channel or a single long channel select gate.

By ganged together, it is meant that the same voltage is applied to the multiple components or devices that are the subject of being electrically ganged together or to which a signal, such as a stability pulse or pulse for a write or read operation, is applied. Such an applied pulse can be referred to as a ganged pulse. An example of a vertical gang is the application of the same voltage to SGD0, SGD1, and SGD2 in a single given sub-block. A vertical gang can be performed, for example, during a read or write operation. An example of a horizontal gang is the application of the same voltage to similar devices across the sub-blocks 102-0, 102-1, 102-2, and 102-3. A horizontal gang can be performed in application of a selector stabilizer pulse to apply, for example, a program voltage (VPGM), as a selector stabilizer pulse, to SGD0 only in each of the sub-blocks 102-0, 102-1, 102-2, and 102-3 and to apply the VPGM voltage concurrently for all SGD0s of these four sub-blocks. In this horizontal example, one VPGM driver can be selectively connected to drive the four SGD0s of the different sub-blocks.

With the selector devices of the memory array 100 structured like the memory cells of the memory array 100, these selector devices are programmable. The selector devices are programmed once after fabrication in production flow to set the Vt for operation of the memory die. For memory cells of a memory array fabricated as charge trap structures in vertical strings, the selector devices can be fabricated as charge trap structures in the vertical strings. The charge trap structures of the memory cells and the selector devices can be fabricated having the same structural parameters such as channel length, materials, dimensions of regions of the charge trap structures, etc. At the end of fabrication, the selector devices can be programmed to have a set Vt by controlling charge stored in the charge trap structures that are the selector devices. After setting, this Vt is intended to be stable through the end of life of the NAND memory die. If the Vt of each of the selector devices is not stable, then uncorrectable error correction code (UECC) errors can occur due to increased bit error rate caused by non-optimal selector device on/off characteristics. Application of a selector stabilizer pulse after an erase operation can be implemented to avoid issues associated with an unstable Vt of a selector device in a memory array.

Figure 2:
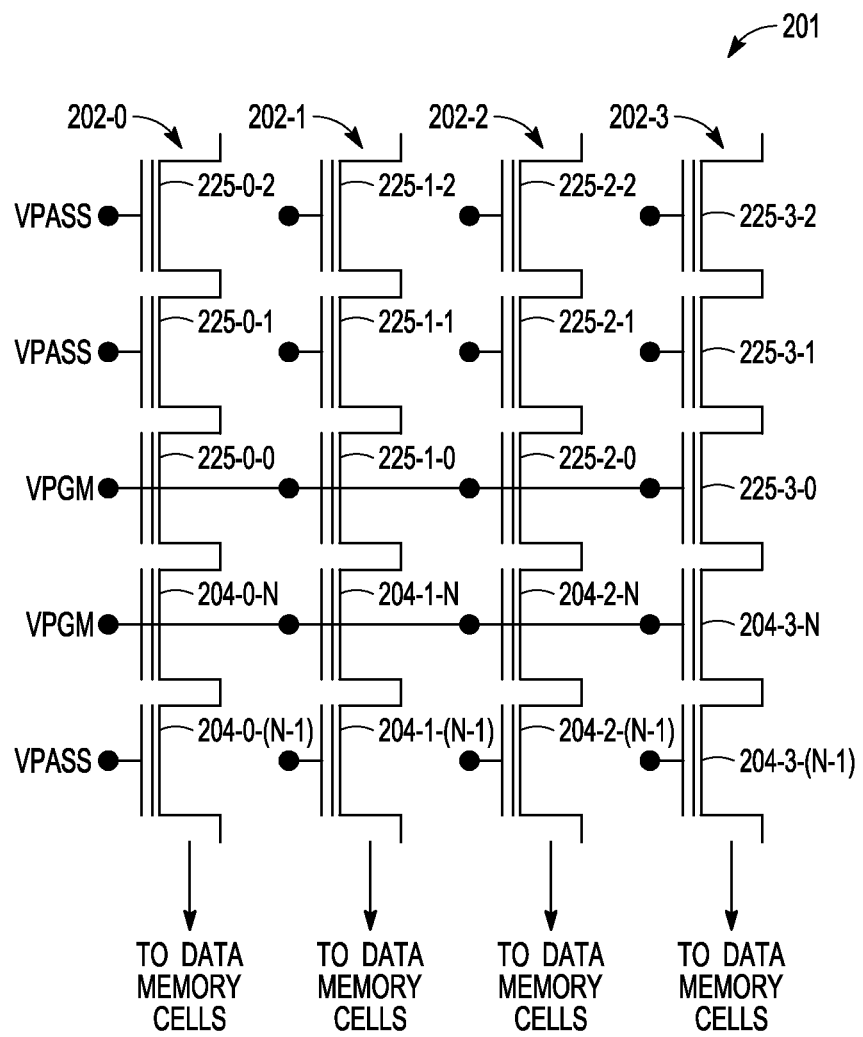
FIG. 2 illustrates an example application of signals applied to sub-blocks of a block of memory cells in a selector stability pulse procedure, according to various embodiments.

FIG. 2 illustrates an embodiment of an example application of signals applied to sub-blocks 202-0, 202-1, 202-3, and 202-3 of a block 201 of memory cells in a selector stability pulse procedure. The applied signals can be applied as part of a modified erase algorithm that includes the application of the selector stability pulse. The sub-blocks 202-0, 202-1, 202-3, and 202-3 can be arranged similar to the sub-blocks of FIG. 1. The block 201 of memory cells in which the sub-blocks 202-0, 202-1, 202-3, and 202-3 are disposed can have more or less than the four blocks shown in FIG. 2. The memory die containing the block 201 of memory cells can have more than one block. Sub-block 202-0 includes a string having selector devices 225-0-0, 225-0-1, and 225-0-2 and N memory cells with at least memory cell 204-0-N being a dummy memory cell, with these selector devices and N memory cells arranged vertically in the string. A memory cell 204-0-(N−1) can be a second dummy memory cell of multiple dummy memory cells among the N memory cells. Selector device 225-0-0 is the bottom-most of the selector devices 225-0-0, 225-0-1 and 225-0-2 in the string, and the dummy memory cell 204-0-N is the top-most memory cell of the string. Each memory cell of the N memory cells is structured the same and the selector device 225-0-0 can have the structure of the memory cells. The sub-blocks 202-0 can include more than the one string shown in FIG. 2.

Sub-block 202-1 includes a string having selector devices 225-1-0, 225-1-1 and 225-1-2 and N memory cells with at least memory cell 204-1-N being a dummy memory cell, with these selector devices and N memory cells arranged vertically in the string. A memory cell 204-1-(N−1) can be a second dummy memory cell of multiple dummy memory cells among the N memory cells. Selector device 225-1-0 is the bottom-most of the selector devices 225-1-0, 225-1-1 and 225-1-2 in the string, and the dummy memory cell 204-1-N is the top-most memory cell of the string. Each memory cell of the N memory cells is structured the same and the selector device 225-1-0 can have the structure of the memory cells. The sub-blocks 202-1 can include more than the one string shown in FIG. 2.

Sub-block 202-2 includes a string having selector devices 225-2-0, 225-2-1 and 225-2-2 and N memory cells with at least memory cell 204-2-N being a dummy memory cell, with these selector devices and N memory cells arranged vertically in the string. A memory cell 204-2-(N−1) can be a second dummy memory cell of multiple dummy memory cells among the N memory cells. Selector device 225-2-0 is the bottom-most of the selector devices 225-2-0, 225-2-1 and 225-2-2 in the string, and the dummy memory cell 204-2-N is the top-most memory cell of the string. Each memory cell of the N memory cells is structured the same and the selector device 225-2-0 can have the structure of the memory cells. The sub-blocks 202-2 can include more than the one string shown in FIG. 2.

Sub-block 202-3 includes a string having selector devices 225-3-0, 225-3-1 and 225-3-2 and N memory cells with at least memory cell 204-3-N being a dummy memory cell, with these selector devices and N memory cells arranged vertically in the string. A memory cell 204-3-(N−1) can be a second dummy memory cell of multiple dummy memory cells among the N memory cells. Selector device 225-3-0 is the bottom-most of the selector devices 225-3-0, 225-3-1 and 225-3-2 in the string, and the dummy memory cell 204-3-N is the top-most memory cell of the string. Each memory cell of the N memory cells is structured the same and the selector device 225-3-0 can have the structure of the memory cells. The sub-blocks 202-3 can include more than the one string shown in FIG. 2.

As part of the modified erase operation, a ganged program pulse is applied to a select line coupled to the bottom-most selector device and to the WL coupled to the top-most drain-side dummy memory cell. The ganged program pulse can be applied to the bottom-most selector device and to the top-most drain-side dummy memory cell of the strings of all the sub-blocks of the block. The ganged program pulse is applied post an erase operation as part of the regular operational erase mode. The ganged program pulse can be a VPGM pulse, such as used in a write operation. Alternatively, the ganged program pulse can be controlled to have a voltage different from VPGM or have a pulse width different from that of the VPGM pulse. Vpass can be applied to the other selector devices and memory cells in the strings of the sub-blocks, for example as shown in FIG. 8. The applied ganged program pulse is used to re-combine the accumulated holes from an erase operation and stabilize Vt of selector devices through program and erase cycles. This reduction or elimination of accumulated holes over a period of erase operations helps in improving the stability of the Vt of selector devices on 3D memory devices such as 3D NAND memory devices including RG 3D NAND memory devices.

The ganged program pulse applied in this manner is a selector stability pulse. As shown in FIG. 2, this program pulse can be applied as a ganged program pulse to the bottom-most selector devices 225-0-0, 225-1-0, 225-2-0, and 225-3-0 of all sub-blocks 202-0, 202-1, 202-3, and 202-3, respectively, of the block 201 of memory cells. This program pulse can be applied as a ganged program pulse to the top-most dummy memory cells 204-0-N, 204-1-N, 204-2-N, and 204-3-N of all sub-blocks 202-0, 202-1, 202-3, and 202-3, respectively, of the block 201 of memory cells. This program pulse can be applied as a ganged program pulse to the bottom-most selector devices 225-0-0, 225-1-0, 225-2-0, and 225-3-0 and the top-most dummy memory cells 204-0-N, 204-1-N, 204-2-N, and 204-3-N of all sub-blocks 202-0, 202-1, 202-3, and 202-3, respectively, of the block 201 of memory cells. Embedding this selector stability pulse as part of the erase algorithm causes no substantial additional performance penalty.

FIGS. 3A and 3B illustrate a representation of program and erase cycling without and with application of a selector stability pulse. Such a selector stability pulse can be applied as discussed with respect to FIG. 2. In this representation, a dummy word line (DWL) 306 to a dummy memory cell that is adjacent to a bottom-most SGD in the same string is considered, with the SGD coupled to a select line for the bottom-most SGD (SGD0-SL) 307. With the SGD structured like the memory cell in the same semiconductor pillar for the string, each of the DWL 306 and the adjacent SGD0-SL 307 includes a portion coupled to a transistor gate that is disposed above a region 311 for storing charge in the semiconductor pillar.

FIG. 3A illustrates program and erase cycling without application of a selector stability pulse. Prior to a first program and erase operation, electrons are in region 311 below the DWL 306 and below the SGD0-SL 307, where the region 311 stores charge. After the first program and erase operation, holes accumulate below the DWL 306. After a second program and erase operation, additional holes accumulate below the DWL 306. In the sequences of FIG. 3A, no operations are conducted to compensate for the hole accumulation. With compensation after a number of program and erase operations, for example N operations, hole accumulation in region 311 can result in holes migrating to under the SGD0-SL 307. After the $N^{th}$ program and erase operation, the region 311 has a degraded region 340 under the selector under the SGD0-SL 307 causing degradation of the Vt of the SGD to which SGD0-SL 307 is coupled above region 311. The main contribution to the Vt degradation through the one to N program and erase cycles is through hole accumulation and migration in region 311 under DWL 306 to SGD0-SL 307. Simulations show that the bottom-most selector, SGD0, can have a significant Vt degradation over a number of program and erase cycles.

FIG. 3B illustrates program and erase cycling with application of stabilizer pulses 305-1, 305-2, . . . 305-N to the DWL 306 and the SGD0-SL 307 of FIG. 3A. The stabilizer pulses 305-1, 305-2, . . . 305-N can be applied the DWL 306 and the SGD0-SL 307 as ganged program pulses right after each erase operation. Prior to a first program and erase operation, electrons are in the region 311 below the DWL 306 and below the SGD0-SL 307. After the erase operation of the first program and erase operation, holes accumulate below the DWL 306. After the erase operation of the first program and erase operation, the stabilizer pulse 305-1 is applied to the DWL 306 and the SGD0-SL 307, resulting in electrons injected into region 311 compensating for the holes injected due to the first program and erase operation. After a second program and erase operation, holes again accumulate below the DWL 306. After the erase operation of the second program and erase operation, the stabilizer pulse 305-2 is applied to the DWL 306 and the SGD0-SL 307, resulting in electrons injected into region 311 compensating for the holes injected due to the second program and erase operation. Cycles of program and erase operations continue to be performed. After the $N^{th}$ program and erase operation, the stabilizer pulse 305-N is applied to the DWL 306 and the SDG0-SL 307, resulting in electrons injected into region 311 compensating for the holes injected due to the $N^{th}$ program and erase operation. The region 311 has a stable region 345 of the selector SGD under the SGD0-SL 307, which provides for a stabilization of the Vt of the SGD to which SGD0-SL 307 is coupled above region 311. The use of selector stability pulses can help re-combine the holes immediately after an erase operation is completed, for example as shown in FIG. 7, which leads to stabilizing the VT of the selector device through program and erase cycles.

Variations of application of stabilizer pulses can be made in the stabilization of selector devices in a memory array. A stabilizer pulse can be applied after multiple erase operations, rather than after each erase operation. The selection of the number of erase operations to be performed prior to application of a stabilizer pulse can be controlled by a memory controller on the memory die. This number of erase operations can be stored at locations in the memory device such as memory caches or registers that can be updated. The memory controller can be operable to adjust application of the program pulse based on other features stored in the memory device. In addition to controlling the application of the stabilizer pulse after a number of erase operations to a string before applying the stabilizer pulse, the features adjustable by the memory controller can be selected from one or more of a pulse width of a program pulse used for the stabilizer pulse, a number of program pulses to apply in the stabilization procedure, voltage step control for program pulses, a voltage start setting to apply the program pulse, and a trim setting to enable or disable application of the program pulse. The pulse width and amplitude of the program pulse used for the stabilization can be the same as or vary from the program pulse for a write operation. In some embodiments, the stabilization can include application of multiple program pulses directly following a erase operation or directly following an erase operation after completing multiple erase operations. The features can be stored in the memory device such as in memory caches or registers that can be updated in status commands that adjust parameters stored in a mode register, for example.

Figure 4:
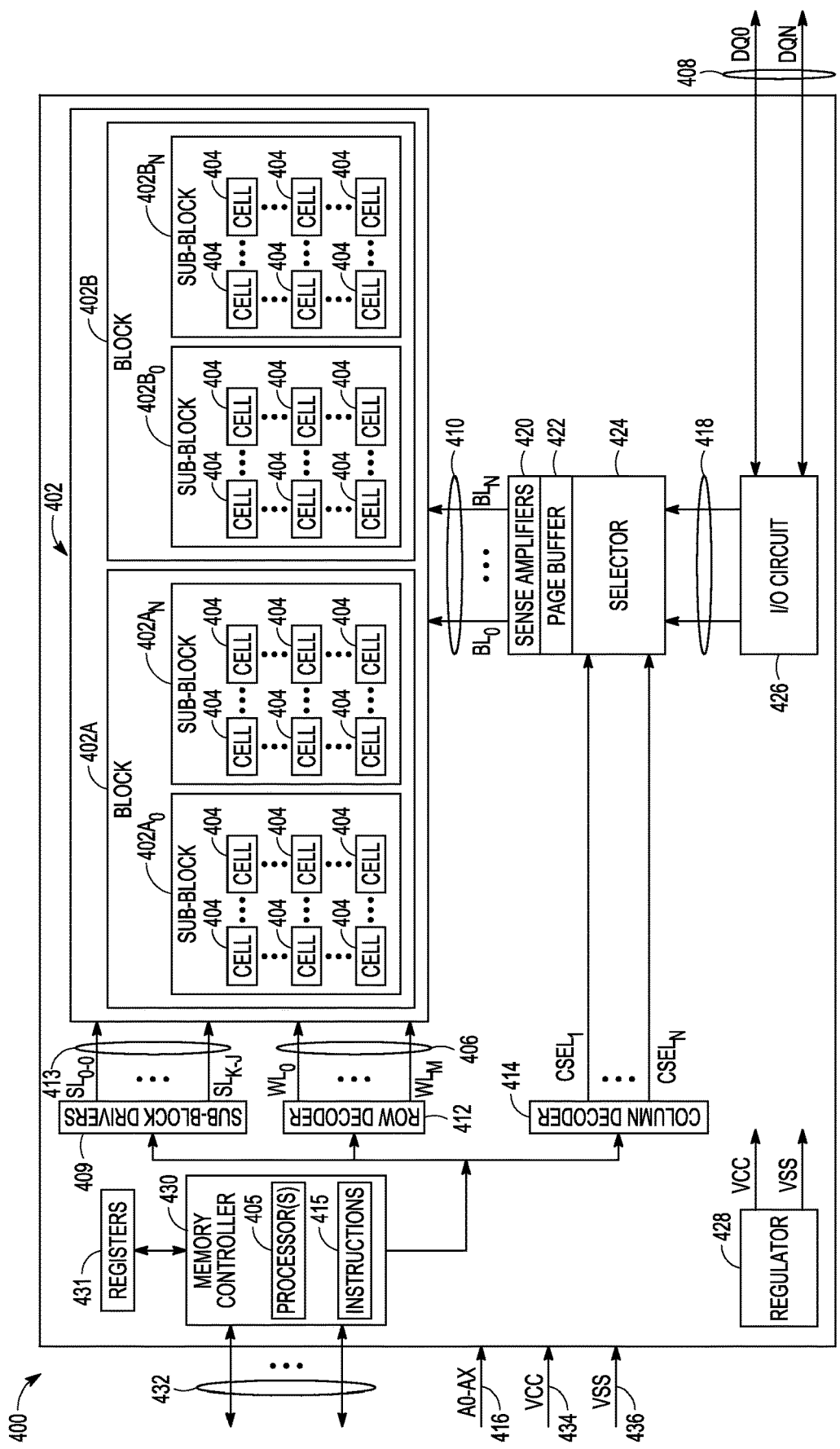
FIG. 4 illustrates a functional block diagram of an example memory device including a memory array having a plurality of memory cells, and one or more circuits or components to provide communication with, or perform one or more memory operations on, the memory array, according to various embodiments.

FIG. 4 illustrates a functional block diagram of an example memory device 400 including a memory array 402 having a plurality of memory cells 404, and one or more circuits or components to provide communication with, or perform one or more memory operations on, the memory array 402. The memory device 400 can be a memory die, for example, a NAND memory die. The memory array 402 can be implemented similar to the memory array 100 of FIG. 1. The memory device 400 can include a row decoder 412, a column decoder 414, sub-block drivers 409, sense amplifiers 420, a page buffer 422, a selector 424, an I/O circuit 426, and a memory controller 430. The memory controller 430 can include processing circuitry, including one or more processors 405, and can be configured to perform operations of the memory device 400 by executing instructions 415. For purposes of the present example, the instructions may be performed by memory within or dedicated to memory controller 430. In other examples, at least some portion of the instructions executed by memory controller 430 may be stored in other memory structures and loaded, for example into local (memory controller) memory for execution by the memory controller 430. The operations can include an erase algorithm having a selector stability pulse procedure to stabilize Vts of selector devices as taught herein.

The memory cells 404 of the memory array 402 can be arranged in blocks, such as first and second blocks 402A, 402B. Each block can include sub-blocks. For example, the first block 402A can include first and second sub-blocks 402A$_0$, 402A$_N$, and the second block 402B can include first and second sub-blocks 402B$_0$, 402B$_N$. Each sub-block can include a number of physical pages, with each page including a number of memory cells 404. Although illustrated herein as having two blocks, with each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory controller 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432 or the address signals on the address line 416. Examples of devices external to the memory device 400 can include, but are not limited to, a host, an external memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of access lines (WL$_0$-WL$_M$)) or the first data lines 410 (e.g., one or more of a plurality of data lines (BL0-BLN)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string associated with the data lines 410.

One or more devices external to the memory device 400 can communicate with the memory device 400 using the I/O lines (DQ0-DQN) 408, address lines 416 (A0-AX), or control lines 432. The I/O circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL$_1$-CSEL$_N$). The selector 424 (e.g., a select circuit) can receive the column select signals (CSEL$_1$-CSEL$_N$) and select data in the page buffer 422 representing values of data to be read from or to be programmed into memory cells 404. Selected data can be transferred between the page buffer 422 and the I/O circuit 426 using second data lines 418.

The memory controller 430 can receive positive and negative supply signals, such as a supply voltage (Vcc) 434 and a negative supply (Vss) 436 (e.g., a ground potential) with respect to Vcc, from an external source or supply (e.g., an internal or external battery, an AC-to-DC converter, etc.). In certain examples, the memory controller 430 can include a regulator 428 to internally provide positive or negative supply signals.

To program or write data to a memory cell, a VPGM (e.g., one or more programming pulses, etc.) can be applied to selected access lines (e.g., WL$_i$), and, thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channels between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a Vpass can be applied to one or more access lines having memory cells that are not targeted for programming, or an inhibit voltage (e.g., Vcc) can be applied to data lines having memory cells that are not targeted for programming, for example, to inhibit charge from being transferred from the channels to the floating gates of such non-targeted memory cells. The pass voltage can be variable, depending, for example, on the proximity of the applied pass voltages to a access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channels, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channels.

When a host, which is a user device, sends an address to the memory device 400, it typically can have an identification of a block, a page, and a column. The identification of the block is used to select the block of interest in the operation. The identification of page is used to select the WL on which the page resides, and it also is used to select one particular sub-block as the WL is shared among the sub-blocks of the block. The sub-block on which the page resides is decoded and that sub-block is selected. The address provided by the user device is used to turn on and off the selector device and access memory cell. In typical operations, one sub-block only is selected such that SGDs of one sub-block are active.

Based on the address provided by the user device, the memory controller 430 can select any one sub-block or all sub-blocks. The memory controller 430 can generate the sub-block address to the sub-block drivers 409 and select any one sub-block or all sub-blocks. The memory controller 430 can send the WL information to the row decoder 412 and a column address to the column decoder 414.

The sub-block drivers 409 can include a number of independent drivers that generates signals to select lines 413 $SL_{0-0}$ . . . $SL_{K-J}$. For an architecture in which each string includes a series of SGD0, SGD1 and SGD2 devices, each of the SGD0, SGD1 and SGD2 devices in each sub-block has its own driver such that they can be controlled individually, such that per each sub-block, there are three SGD drivers. For N sub-blocks having M SGDs, there are M*N individual drivers that can be addressed. For example, for four sub-blocks having three SGDs, the sub-block drivers 409 can have 12 drivers that can be addressed. There is full flexibility on either turning on one SGD (SG0, SGD1, or SGD2) in one sub-block or all sub-blocks. Similarly, there is full flexibility to turn on all SGDs (SG0, SGD1, and SGD2) at the same time on one sub-block or all sub-blocks. Similarly, the sub-block drivers 409 can include R*N drivers for R SGS devices in the N sub-blocks. Multiple input signals can be assigned to each individual driver, depending on the different voltages designed for operation of the respective driver during erase operations, program operations, and read operations. From the sub-block drivers 409, appropriate operational signals can be sent to the memory array 402 via the select lines 413 ($SL_{(sub-block\ \#)-(SGD\ \#or\ SGS\ \#)}$) $SL_{0-0}$ . . . $SL_{K-J}$.

In typical read and write operations, SGD0, SGD1, SGD2 devices in one sub-block can be driven together by one particular regulator, while the select gates in other sub-blocks are driven to another voltage such as ground (0V). This is a case of a vertical gang with one signal driving all select gates in a given sub-block.

In a selector stabilizer pulse operation, the memory controller 430 has the flexibility to control each SGD per sub-block in the sub-block drivers 409. In the selector stabilizer pulse operation, a VPGM voltage can be supplied to SGD0 only and concurrently for all the SGD0s of all the sub-blocks of the block, for example, the SGD0s of the four sub-blocks of FIGS. 1 and 2. One VPGM driver can be connected to four SGD0s from the different sub-blocks of FIGS. 1 and 2 under the control of the memory controller 430. With the VPGM voltage supplied only to SGD0, a Vpass voltage can be supplied to the SGD1 and SGD2 devices in all of the sub-blocks of the block during the selector stabilizer pulse operation.

The instructions to finish erase verify operations and then perform selector stabilize pulse operations can be provided by the instructions 415 in the memory controller 430 on the memory device 400. The memory controller 430 can be operable to adjust application of the program pulse based on other features stored in the memory device. The features adjustable by the memory controller 430 can be selected from one or more of a number of erase operations to a string before applying the stabilizer pulse, a pulse width of a program pulse used for the stabilizer pulse, a number of program pulses to apply in the stabilization procedure, voltage step control for program pulses, a voltage start setting to apply the program pulse, and a trim setting to enable or disable application of the program pulse. The features can be stored in registers 431 of the memory device 400 that can be updated in status commands that adjust parameters for the memory device 400. The registers 431 or other such storage components can be included in the memory controller 430.

Figure 5:
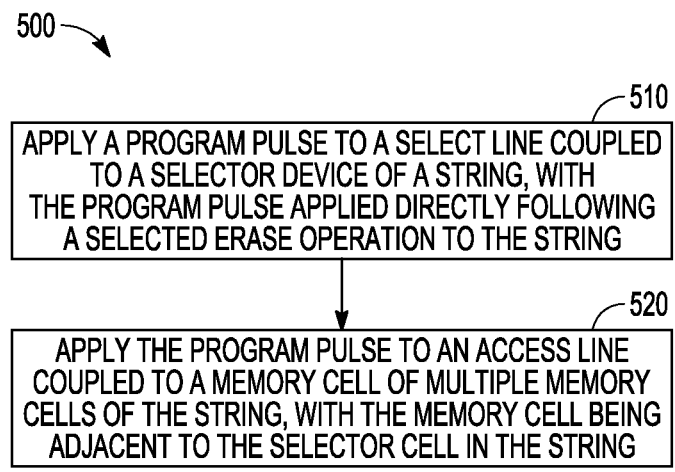
FIG. 5 is a flow diagram of features of an example method of stabilizing a selector device of a string of cells of a memory array of a memory device, according to various embodiments.

FIG. 5 is a flow diagram of features of an embodiment of an example method 500 of stabilizing a selector device of a string of cells of a memory array of a memory device. At 510, a program pulse is applied to a select line coupled to the selector device, with the program pulse applied directly following a selected erase operation to the string. Considering FIG. 1 for example, a program pulse is applied to SGD0 immediately after an erase operation. The erase operation can include a verify function. The program pulse can be applied directly following each erase operation to the string. The selector device can be a select gate transistor arranged in the string to couple the memory cells of the string to a data line, with the selector device being a bottom-most selector of a number of selector devices arranged in series vertically in the string.

At 520, the program pulse is applied to an access line coupled to a memory cell of multiple memory cells of the string, with the memory cell being adjacent to the selector device in the string. The memory cell adjacent to the selector device can be a dummy memory cell arranged as a top-most memory cell of the multiple memory cells of the string, with the multiple memory cells arranged in series vertically in the string. Considering FIG. 2 for example, a program pulse is applied to the top DWL, after a program pulse to SGD0, at 510. The program pulse can be applied as a ganged program pulse to the selector device and to the dummy memory cell adjacent to the selector device. For example, a ganged program pulse can be applied to both SGD0 and the top DWL of a string (vertical gang) and also gang the program pulse horizontally across subblocks. In a stabilizing operation of a selector device, a memory controller has the flexibility to control each selector per sub-block using sub-block drivers of the memory device. In the stabilizing operation, the program pulse can be supplied to a bottom-most selector of a string only and concurrently for all the bottom-most selectors of all the sub-blocks of the block. With the program pulse supplied only to the bottom-most selectors of the sub-blocks of the block, a pass voltage can be supplied to the other selector devices arranged above the bottom-most selector in all of the sub-blocks of the block during the stabilizing operation.

Variations of the method 500 or methods similar to the method 500 can include a number of different embodiments that may be combined depending on the application of such methods and/or the architecture of memory devices in which such methods are implemented. Such methods can include stabilizing a selector device in each string of multiple strings of each sub-block of multiple sub-blocks of a block of memory cells of the memory array by application of the program pulse, directly following an erase operation, as a ganged program pulse to the selector devices of the multiple sub-blocks.

Variations of the method 500 or methods similar to the method 500 can include adjusting application of the program pulse, using a memory controller of the memory device, based on a feature stored in the memory device. The feature can be selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

In various embodiments, a memory device can comprise a memory array having strings of cells and a memory controller including processing circuitry including one or more processors, with the memory controller configured to perform operations with respect to the memory array. Each string of the memory array can include a selector device and multiple memory cells, with the selector device coupled to a select line and each of the multiple memory cells coupled to a respective access line. The operations performed using the memory controller can comprise applying a program pulse to the select line coupled to the selector device of a string of the memory array and to the access line coupled to a memory cell of the multiple memory cells of the string with the memory cell being adjacent to the selector device in the string. The program pulse is applied directly following an erase operation to the string.

Variations of such a memory device or similar memory devices can include a number of different embodiments that may be combined depending on the application of such memory devices and/or the architecture in which such memory devices are implemented. Such memory devices can include the selector device being a select gate transistor arranged in the string to couple the memory cells of the string to a data line. The selector device can have a memory cell structure. Such a selector device can have a threshold voltage set at end of production flow in fabrication. The memory cell adjacent to the selector device can be a dummy memory cell.

Variations of such a memory device or similar memory devices can include the memory controller being operable to adjust application of the program pulse based on a feature stored in the memory device. The feature can be selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

In various embodiments, a memory device can comprise a memory array and a memory controller including processing circuitry including one or more processors, with the memory controller configured to perform operations with respect to the memory array. The memory array can have one or more blocks of memory cells, with each block having multiple sub-blocks and each sub-block including multiple strings of cells. Each string includes multiple SGDs and multiple memory cells, with each SGD associated with a select line and each memory cell coupled to an access line for the memory cell. The operations performed using the memory controller can comprise applying a program pulse to the select line associated with a SGD of the multiple SGDs of a string of a sub-block of the memory array and to the access line coupled to a memory cell of the multiple memory cells of the string with the memory cell being adjacent to the SGD in the string. The program pulse is applied directly following an erase operation to the string. The adjacent memory cell can be one of a number of dummy memory cells.

Variations of such a memory device or similar memory devices can include a number of different embodiments that may be combined depending on the application of such memory devices and/or the architecture in which such memory devices are implemented. Such memory devices can include the SGD being a select gate transistor arranged in the string to couple the memory cells of the string to a data line, with the SGD being a bottom-most SGD of the multiple SGDs arranged in series vertically in the string. Each SGD of each string of the multiple strings can have a memory cell structure. Each SGD can have a threshold voltage set at end of production flow in fabrication. The multiple SGDs of a string can be accessed together to select the string for a write or read operation on a memory cell of the string. The memory cell adjacent to the SGD can be a dummy memory cell arranged as a top-most memory cell of the multiple memory cells of the string, with the multiple memory cells arranged in series vertically in the string. The memory cell adjacent to the SGD can be a dummy memory cell arranged as a top-most dummy memory cell of a number of dummy memory cells above data memory cells of the string.

Variations of such a memory device or similar memory devices can include the operations including: applying, for each string, the program pulse to a bottom-most SGD of the multiple SGDs arranged in series vertically in the string, as a ganged program pulse to the bottom-most SGDs of the multiple sub-blocks; and applying the program pulse to an adjacent memory cell to the bottom-most SGD of each string of the multiple sub-blocks, with the adjacent memory cell of each string of the multiple sub-blocks being a dummy memory cell arranged as a top-most memory cell of the multiple memory cells of the string, with the multiple memory cells arranged in series vertically in the string. The memory controller can be operable to adjust application of the program pulse based on a feature stored in the memory device. The feature can be selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 6:
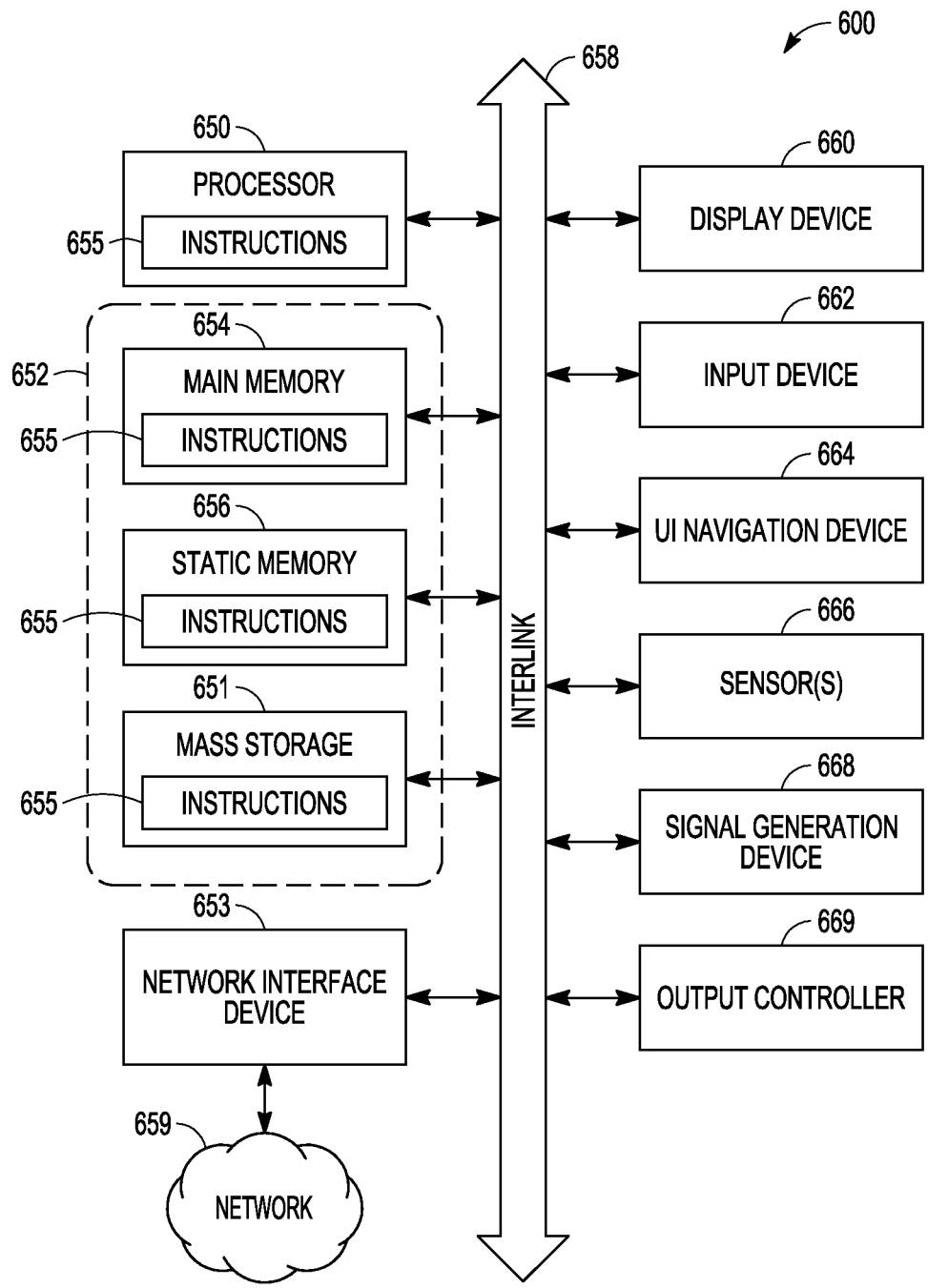
FIG. 6 illustrates a block diagram of an example machine having one or more memory devices structured to perform stabilization of selector devices in a memory array of the one or more memory devices, according to various embodiments.

FIG. 6 illustrates a block diagram of an example machine 600 having one or more memory devices structured to perform stabilization of selector devices in a memory array of the one or more memory devices. Such memories can include stored instructions to execute a selector stabilizer pulse operation following an erase operation with possible variations as discussed with respect to the method 500 associated with FIG. 5. A memory controller of the memory device, such as a microcontroller of the memory device, can execute modified erase algorithms to stabilize the Vts of selector devices of the memory arrays of the one or more memory devices, as taught herein. The machine 600, having one or more such memory devices, may operate as a standalone machine or may be connected, for example networked, to other machines.

In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 600 can be arranged to operate with one or more memory devices to perform stabilization of selector devices of the one or more memory devices as taught herein. The example machine 600 can include one or more memory devices having structures as discussed with respect to the memory array 100 of FIG. 1, the block 201 of memory cells of FIG. 2, and the memory device 400 of FIG. 4.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 650 (e.g., a CPU, a GPU, a hardware processor core, or any combination thereof), a main memory 654, and a static memory 656, some or all of which may communicate with each other via an interlink (e.g., bus) 658. The machine 600 may further include a display device 660, an alphanumeric input device 662 (e.g., a keyboard), and a user interface (UI) navigation device 664 (e.g., a mouse). In an example, the display device 660, input device 662, and UI navigation device 664 may be a touch screen display. The machine 600 may additionally include a mass storage device (e.g., drive unit) 651, a signal generation device 668 (e.g., a speaker), a network interface device 653, and one or more sensors 666, such as a global positioning system (GPS) sensor, compass, accelerometer, or other sensor. The machine 600 may include an output controller 669, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 600 may include a machine-readable medium 652 on which is stored one or more sets of data structures or instructions 655 (e.g., software) embodying or utilized by the machine 600 to perform any one or more of the techniques or functions for which the machine 600 is designed. The instructions 655 may also reside, completely or at least partially, within the main memory 654, within static memory 656, within the mass storage device 651, or within the hardware processor 650 during execution thereof by the machine 600. In an example, one or any combination of the hardware processor 650, the main memory 654, the static memory 656, or the mass storage device 651 may constitute the machine-readable medium 652.

While the machine-readable medium 652 is illustrated as a single medium, the term "machine-readable medium" may include a single medium or multiple media (e.g., a centralized or distributed database, or associated caches and servers) configured to store the one or more instructions 655. The term "machine-readable medium" may include any medium that is capable of storing, encoding, or carrying instructions for execution by the machine 600 and that cause the machine 600 to perform any one or more of the techniques to which the machine 600 is designed, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 655 (e.g., software, programs, an operating system (OS), etc.) or other data, stored on the mass storage device 651, can be accessed by the main memory 654 for use by the processor 650. The main memory 654 (e.g., DRAM) is typically fast, but volatile, and thus a different type of storage than the mass storage device 651 (e.g., an SSD), which is suitable for long-term storage, including while in an "off" condition. The instructions 655 or data in use by a user or the machine 600 are typically loaded in the main memory 654 for use by the processor 650. When the main memory 654 is full, virtual space from the mass storage device 651 can be allocated to supplement the main memory 654; however, because the mass storage device 651 is typically slower than the main memory 654, and write speeds are typically at least twice as slow as read speeds, use of virtual memory can greatly reduce user experience due to storage device latency (in contrast to the main memory 654, e.g., DRAM). Further, use of the mass storage device 651 for virtual memory can greatly reduce the usable lifespan of the mass storage device 651.

In contrast to virtual memory, virtual memory compression (e.g., the Linux® kernel feature "ZRAM") uses part of the memory as compressed block storage to avoid paging to the mass storage device 651. Paging takes place in the compressed block until it is necessary to write such data to the mass storage device 651. Virtual memory compression increases the usable size of main memory 654, while reducing wear on the mass storage device 651.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA-based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 655 may further be transmitted or received over a communications network 659 using a transmission medium via the network interface device 653 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 653 may include one or more physical jacks (e.g., Ethernet, coaxial, or phone jacks) or one or more antennas to connect to the communications network 659. In an example, the network interface device 653 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 600, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a memory array having strings of cells, each string including a selector device and multiple memory cells, with the selector device coupled to a select line and each of the multiple memory cells coupled to a respective access line; and a memory controller including processing circuitry including one or more processors, the memory controller configured to perform operations comprising applying a program pulse to the select line coupled to the selector device of a string of the memory array and to the access line coupled to a memory cell of the multiple memory cells of the string with the memory cell being adjacent to the selector device in the string, wherein the program pulse is applied directly following a selected erase operation to the string.

An example memory device 2 can include features of example memory device 1 and can include the selector device being a select gate transistor arranged in the string to couple the memory cells of the string to a data line.

An example memory device 3 can include features of any of the preceding example memory devices and can include the memory cell adjacent to the selector device being a dummy memory cell.

An example memory device 4 can include features of any of the preceding example memory devices and can include the selector device having a memory cell structure.

An example memory device 5 can include features of example memory device 4 and any of the preceding example memory devices and can include the selector device having a threshold voltage set at end of production flow in fabrication.

An example memory device 6 can include features of any of the preceding example memory devices and can include the memory controller being operable to adjust application of the program pulse based on a feature stored in the memory device.

An example memory device 7 can include features of example memory device 6 and any of the preceding example memory devices and can include the feature being selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

In an example memory device 8, any of the memory devices of example memory devices 1 to 7 may include memory devices incorporated into an electronic memory apparatus further comprising a host processor and a communication bus extending between the host processor and the memory device.

In an example memory device 9, any of the memory devices of example memory devices 1 to 8 may be modified to include any structure presented in another of example memory device 1 to 8.

In an example memory device 10, any apparatus associated with the memory devices of example memory devices 1 to 9 may further include a machine-readable storage device configured to store instructions as a physical state, wherein the instructions may be used to perform one or more operations of the apparatus.

In an example memory device 11, any of the memory devices of example memory devices 1 to 10 may be operated in accordance with any of the methods of the below example methods 1 to 8.

An example memory device 12 can comprise: a memory array having one or more blocks of memory cells, with each block having multiple sub-blocks, each sub-block including multiple strings of cells, each string including multiple drain-side select gates (SGDs) and multiple memory cells, with each SGD associated with a select line and each memory cell coupled to an access line; and a memory controller including processing circuitry including one or more processors, the memory controller configured to perform operations comprising applying a program pulse to the select line associated with a SGD of the multiple SGDs of a string of a sub-block of the memory array and to the access line coupled to a memory cell of the multiple memory cells of the string with the memory cell being adjacent to the SGD in the string, wherein the program pulse is applied directly following a selected erase operation to the string.

An example memory device 13 can include features of example memory device 12 and can include the SGD being a bottom-most SGD of the multiple SGDs arranged in series vertically in the string.

An example memory device 14 can include features of any of the preceding example memory devices 12 to 13 and can include the memory cell adjacent to the SGD being a dummy memory cell arranged as a top-most memory cell of the multiple memory cells of the string, with the multiple memory cells arranged in series vertically in the string.

An example memory device 15 can include features of any of the preceding example memory devices 12 to 14 and can include the operations to include: applying the program pulse, as a ganged program pulse, to a bottom-most SGD of each string of the multiple sub-blocks; and applying the program pulse to an adjacent memory cell to the bottom-most SGD of each string of the multiple sub-blocks, with the adjacent memory cell of each string of the multiple sub-blocks being a dummy memory cell arranged as a top-most memory cell of the multiple memory cells of the string, with the multiple memory cells arranged in series vertically in the string.

An example memory device 16 can include features of any of the preceding example memory devices 12 to 15 and can include each SGD of each string of the multiple strings having a memory cell structure.

An example memory device 17 can include features of any of the preceding example memory devices 12 to 16 and can include the memory controller being operable to adjust application of the program pulse based on a feature stored in the memory device.

An example memory device 18 can include features of example memory device 17 and any of the preceding example memory devices 12 to 16 and can include the feature being selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

An example memory device 19 can include features of any of the preceding example memory devices 12 to 18 and can include the number of selector devices of a string being accessed together to select the string for a write or read operation on a memory cell of the string.

In an example memory device 20, any of the memory devices of example memory devices 12 to 19 may include memory devices incorporated into an electronic memory apparatus further comprising a host processor and a communication bus extending between the host processor and the memory device.

In an example memory device 21, any of the memory devices of example memory devices 12 to 20 may be modified to include any structure presented in another of example memory device 12 to 20.

In an example memory device 22, any of apparatus associated with the memory devices of example memory devices 12 to 21 may further include a machine-readable storage device configured to store instructions as a physical state, wherein the instructions may be used to perform one or more operations of the apparatus.

In an example memory device 23, any of the memory devices of example memory devices 12 to 22 may be operated in accordance with any of the methods of the following example methods 1 to 8.

An example method 1 of stabilizing a selector device of a memory array of a memory device can comprise: applying a program pulse to a select line coupled to the selector device and to an access line coupled to a memory cell of multiple memory cells of the string, with the memory cell being adjacent to the selector device in the string, wherein the program pulse applied directly following a selected erase operation to the string.

An example method 2 of stabilizing a selector device of a memory array of a memory device can include features of example method 1 of stabilizing a selector device of a memory array of a memory device and can include the selector device being a select gate transistor arranged in the string to couple the memory cells of the string to a data line, with the selector device being a bottom-most selector of a number of selector devices arranged in series vertically in the string; and the memory cell adjacent to the selector device being a dummy memory cell arranged as a top-most memory cell of the multiple memory cells of the string, with the multiple memory cells arranged in series vertically in the string.

An example method 3 of stabilizing a selector device of a memory array of a memory device can include features of any of the preceding example methods of stabilizing a selector device of a memory array of a memory device and can include stabilizing a selector device in each string of multiple strings of each sub-block of multiple sub-blocks of a block of memory cells of the memory array by application of the program pulse, directly following an erase operation, as a ganged program pulse to the selector devices of the multiple sub-blocks.

An example method 4 of stabilizing a selector device of a memory array of a memory device can include features of any of the preceding example methods of stabilizing a selector device of a memory array of a memory device and can include adjusting application of the program pulse, using a memory controller of the memory device, based on a feature stored in the memory device.

An example method 5 of stabilizing a selector device of a memory array of a memory device can include features of example method 4 of stabilizing a selector device of a memory array of a memory device and any of the preceding example methods of stabilizing a selector device of a memory array of a memory device and can include the feature being selected from one or more of a number of erase operations to a string before applying the program pulse, a pulse width of the program pulse, a number of program pulses to apply, voltage step control for program pulses, a voltage start setting to apply the program pulse, and a trim setting to enable or disable application of the program pulse.

In an example method 6 of stabilizing a selector device of a memory array of a memory device, any of the example methods 1 to 5 of stabilizing a selector device of a memory array of a memory device may be performed in an electronic memory apparatus further comprising a host processor and a communication bus extending between the host processor and the memory device.

In an example method 7 of stabilizing a selector device of a memory array of a memory device, any of the example methods 1 to 6 of stabilizing a selector device of a memory array of a memory device may be modified to include operations set forth in any other of method examples 1 to 6 of stabilizing a selector device of a memory array of a memory device.

In an example method 8 of stabilizing a selector device of a memory array of a memory device, any of the example methods 1 to 7 of stabilizing a selector device of a memory array of a memory device may be implemented at least in part through use of instructions stored as a physical state in one or more machine-readable storage devices.

An example method 9 of stabilizing a selector device of a memory array of a memory device can include features of any of the preceding example methods 1 to 8 of stabilizing a selector device of a memory array of a memory device and can include performing functions associated with any features of example memory devices 1 to 22.

An example machine-readable storage device 1 storing instructions, that when executed by one or more processors, cause a machine to perform operations, can comprise instructions to perform functions associated with any features of example memory devices 1 to 11 and memory devices 12 to 23 or perform methods associated with any features of example methods 1 to 9.

In various embodiments, a selector stabilizer pulse can be applied to a selector device of a string of a memory array and to a memory cell of multiple memory cells of the string, with the memory cell being adjacent to the selector device in the string. The selector stabilizer pulse can be applied directly following an erase operation to the string to stabilize the threshold voltage of the selector device. The selector stabilizer pulse can be applied as part of the erase algorithm of the memory device. The application of the selector stabilizer pulses can help improve Vt stability of selector devices of the memory array, providing reliability in the operations of the memory device. The selector stabilizer pulse procedure can reduce burden on the firmware of the system in which such a memory device is implemented, since countermeasures for maintenance of selector devices of the memory device can be reduced or avoided. As this feature is part of an erase algorithm, it is seamless to user devices external to the memory device. Overall Vt stability of selector devices can be improved during mass-production of the memory devices, such as 3D NAND memory devices, without any performance penalty.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
a memory array having strings of cells, a first string of the strings having a first selector device, the first selector device coupled to a first select line and coupled to a data line to the memory array; and
one or more drivers to generate a selector signal simultaneously both to the first selector device and to a dummy memory cell of the first string directly adjacent to the first selector device with data memory cells of the first string maintained unselected, in response to a determination of completion of a selected erase operation to at least one data memory cell of the first string, the selected erase operation including an erase verify procedure, the completion completing erasure of the at least one data memory cell of the first string.

2. The memory device of claim 1, wherein the selector signal is a program pulse.

3. The memory device of claim 1, wherein the first selector device has a threshold voltage set at end of production flow in fabrication.

4. The memory device of claim 1, wherein the first selector device is one of multiple selector devices in the first string, arranged serially coupled to the data line.

5. The memory device of claim 4, wherein the one or more drivers include a driver coupled to the multiple selector devices to generate the selector signal simultaneously to the multiple selector devices with a same voltage.

6. The memory device of claim 4, wherein the one or more drivers include:
   a first driver coupled to the first selector device to generate the selector signal; and
   one or more other drivers to generate a pass voltage to the multiple selector devices other than the first selector device when the selector signal is generated to the first selector device, the pass voltage being an unselect voltage.

7. The memory device of claim 1, wherein the dummy memory cell is one of multiple dummy memory cells of the first string.

8. A memory device comprising:
   a memory array having strings of cells, each string including a selector device coupling the string to a data line to the memory array and including multiple memory cells, with the selector device coupled to a select line, each of the multiple memory cells coupled to a respective different access line;
   multiple drivers coupled to the select lines and the access lines; and
   a memory controller to selectively direct one or more drivers of the multiple drivers to generate a selector signal simultaneously both to a first driver coupled to a first select line of a first string of the strings of the memory array and to a dummy memory cell directly adjacent to the first selector device in the first string with data memory cells of the first string maintained unselected, in response to a determination of completion of a selected erase operation to at least one data memory cell of the first string, the selected erase operation including an erase verify procedure, the completion completing erasure of the at least one data memory cell of the first string.

9. The memory device of claim 8, wherein the memory controller is operable to adjust application of the selector signal based on a feature stored in the memory device, the feature being a parameter to control application of the selector signal.

10. The memory device of claim 9, wherein the feature is selected from one or more of a number of erase operations to a string before applying the selector signal, a pulse width of the selector signal generated as a selector pulse, a number of selector signals to apply, voltage step control for selector signals, a voltage start setting to apply the selector signal, and a trim setting to enable or disable application of the selector signal.

11. The memory device of claim 8, wherein the selector device of a string of the strings is one of multiple selector devices of the string and the dummy memory cell of a string of the strings is one of multiple dummy memory cells.

12. The memory device of claim 8, wherein the selector device has a memory cell structure.

13. The memory device of claim 8, wherein the memory array has one or more blocks of memory cells, with each block having multiple sub-blocks, each sub-block including multiple strings of the strings of the memory array, each selector device being a drain-side select gate (SGD).

14. The memory device of claim 13, wherein the SGD is a bottom-most SGD of multiple SGDs arranged in series vertically in the string.

15. The memory device of claim 13, wherein the dummy memory cell directly adjacent to the SGD is arranged as a top-most dummy memory cell of multiple dummy memory cells of the string, with the multiple dummy memory cells arranged in series vertically in the string.

16. The memory device of claim 8, wherein the selector signal is a program pulse.

17. A method of stabilizing a selector device of a memory array of a memory device, the method comprising:
   performing a selected erase operation on at least one data memory cell of a selected string of cells of the memory array, the selected erase operation including an erase verify procedure; and
   generating, using one or more drivers directly following completion of the selected erase operation to the selected string, the completion completing erasure of the at least one data memory cell of the selected string, a selector signal simultaneously both to a selector device of the selected string and to a dummy memory cell of multiple memory cells of the string, with the dummy memory cell being directly adjacent to the selector device in the selected string, with memory cells in the string, other than the dummy memory cell, maintained as unselected.

18. The method of claim 17, wherein:
   the selector device is a select gate transistor arranged in the selected string to couple the memory cells of the selected string to a data line, with the selector device being a bottom-most selector of a number of selector devices arranged in series vertically in the selected string; and
   the dummy memory cell directly adjacent to the selector device is arranged as a top-most memory cell of the multiple memory cells of the selected string, with the multiple memory cells arranged in series vertically in the selected string.

19. The method of claim 17, wherein the method includes stabilizing a selector device in each string of multiple strings of each sub-block of multiple sub-blocks of a block of memory cells of the memory array by application of the selector signal, directly following an erase operation, the erase operation including an erase verify procedure, simultaneously to the selector devices of the multiple sub-blocks.

20. The method of claim 17, wherein the method includes adjusting application of the selector signal as a selector pulse, using a memory controller of the memory device, based on a feature stored in the memory device, the feature being a parameter to control application of the selector pulse.

21. The method of claim 20, wherein the feature is selected from one or more of a number of erase operations to a string before applying the selector pulse, a pulse width of the selector pulse, a number of selector pulses to apply, voltage step control for selector pulses, a voltage start setting to apply the selector pulse, and a trim setting to enable or disable application of the selector pulse.

22. The method of claim 17, wherein generating the selector signal includes generating a program pulse.

\* \* \* \* \*